United States Patent
Parvarandeh (10) Patent No.: US 9,502,356 B1
(45) Date of Patent: Nov. 22, 2016

(54) DEVICE AND METHOD WITH PHYSICAL UNCLONABLE FUNCTION

(71) Applicant: Maxim Integrated Products, Inc., San Jose, CA (US)

(72) Inventor: Pirooz Parvarandeh, Los Altos Hills, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/645,618

(22) Filed: Mar. 12, 2015

(51) Int. Cl.
  *H01L 29/06* (2006.01)
  *H01L 23/544* (2006.01)

(52) U.S. Cl.
  CPC .................... *H01L 23/544* (2013.01)

(58) Field of Classification Search
  CPC ....... G06F 7/588; H03K 3/84; H04L 9/0662; H04L 9/0866
  USPC ......... 257/618, 741, 690, 530; 438/478, 761
  See application file for complete search history.

(56) References Cited

U.S. PATENT DOCUMENTS

| | | | | |
|---|---|---|---|---|
| 2009/0132624 | A1* | 5/2009 | Haselsteiner | G06F 7/588 708/255 |
| 2011/0163088 | A1* | 7/2011 | Besling | H04L 9/3278 219/660 |
| 2013/0087620 | A1* | 4/2013 | Sharma | G06K 19/06037 235/472.01 |
| 2014/0095564 | A1 | 4/2014 | Kwak et al. | |
| 2014/0108786 | A1* | 4/2014 | Kreft | G06F 21/71 713/156 |
| 2015/0084193 | A1* | 3/2015 | Feng | H01L 23/535 257/741 |
| 2015/0170926 | A1* | 6/2015 | Michalak | H01L 23/5329 257/734 |
| 2016/0103065 | A1* | 4/2016 | Lee | G01N 21/553 356/445 |

* cited by examiner

*Primary Examiner* — Mohammed Shamsuzzaman
(74) *Attorney, Agent, or Firm* — Advent, LLP (57) ABSTRACT

A physical unclonable function device, an encryptable electronic device, and a process for fabricating the physical unclonable function device are described. In an implementation, a physical unclonable function device includes an integrated circuit device including an active layer, the active layer including an electrode array with multiple electrodes; and a physical unclonable function coating disposed on the active layer, wherein the physical unclonable function coating includes a physical unclonable material arranged in a random configuration.

3 Claims, 8 Drawing Sheets

DEVICE AND METHOD WITH PHYSICAL UNCLONABLE FUNCTION

BACKGROUND

Physical unclonable function (PUF) includes a function that is embodied within a physical structure. It can include a complex material having a physical entity that is embodied within the physical structure. The PUF may be easy to evaluate but difficult to predict or characterize. Ideally, an individual PUF device should be easy to make but practically impossible to duplicate, even when using the manufacturing process that produced the PUF device.

SUMMARY

A physical unclonable function device, an encryptable electronic device, and a process for fabricating the physical unclonable function device are described. In an implementation, a physical unclonable function device includes an integrated circuit device including an active layer, the active layer including an electrode array with multiple electrodes; and a physical unclonable function coating disposed on the active layer, wherein the physical unclonable function coating includes a physical unclonable material arranged in a random configuration.

In an implementation, an encryptable electronic device includes a printed circuit board; and a physical unclonable function device coupled to the printed circuit board, the physical unclonable function device including an integrated circuit device including an active layer, the active layer including an electrode array with multiple electrodes; and a physical unclonable function coating disposed on the active layer, wherein the physical unclonable function coating includes a physical unclonable material arranged in a random configuration.

In an implementation, a process for fabricating a physical unclonable function device includes receiving an integrated circuit device having an active layer, the active layer including an electrode array with multiple electrodes; and forming a physical unclonable function coating on the active layer of the integrated circuit device, wherein the physical unclonable function coating includes a physical unclonable material arranged in a random configuration. The physical unclonable function device and encryptable electronic device provide a device with a random physical unclonable function coating.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

A physical unclonable function (PUF) includes a function that is embodied in a physical structure. For example, it can include a complex material having a physical entity that is embodied within a physical structure. Each PUF may be easy to evaluate but difficult to predict or characterize. Ideally, an individual PUF device should be easy to make but practically impossible to duplicate, even when using the same manufacturing process that produced the PUF device.

In an implementation, a PUF can include a coating-type PUF, which can be fabricated as a top layer of an integrated circuit (IC). In this embodiment, a network of metal wires or electrodes can be formed on the top layer of the IC. Space between and/or above the metal wires or electrodes can be filled and/or covered with an opaque material and randomly doped with particles, such as dielectric particles. Because of the random placement, size, and dielectric strength of the particles, the capacitance between the metal wires or electrodes can be substantially random. This unique randomness can be used to obtain a unique identifier for a PUF device including the coating-type PUF. Moreover, the formation of this opaque PUF on the top layer of an IC can protect the underlying circuits in the IC from being inspected by an attacker (e.g. for reverse-engineering). If an attacker tries to remove at least a part of the coating-type PUF, the resulting capacitance between the metal wires or electrodes is bound to change and the original unique identifier will be destroyed. It can be challenging to fabricate a coating-type PUF that is cost effective and environmentally stable over time (e.g., resistant to moisture, temperature, etc.) while encoding a random unique identifier within the IC.

Accordingly, a physical unclonable function device, an encryptable electronic device, and a process for fabricating the physical unclonable function device are described. In an implementation, a physical unclonable function device includes an integrated circuit device including an active layer, the active layer including an electrode array with multiple electrodes; and a physical unclonable function coating disposed on the active layer, wherein the physical unclonable function coating includes a physical unclonable material arranged in a random configuration.

In an implementation, an encryptable electronic device includes a printed circuit board; and a physical unclonable function device coupled to the printed circuit board, the physical unclonable function device including an integrated circuit device including an active layer, the active layer including an electrode array with multiple electrodes; and a physical unclonable function coating disposed on the active layer, wherein the physical unclonable function coating includes a physical unclonable material arranged in a random configuration.

In an implementation, a process for fabricating a physical unclonable function device includes receiving an integrated circuit device having an active layer, the active layer including an electrode array with multiple electrodes; and forming a physical unclonable function coating on the active layer of the integrated circuit device, wherein the physical unclonable function coating includes a physical unclonable material arranged in a random configuration. The physical unclonable function device and encryptable electronic device provide a device with a random physical unclonable function coating and a unique identifier that is physically unclonable. The randomness and random configuration of the physical unclonable material can be achieved by mixing different particles of the physical unclonable function material into the physical unclonable function coating (e.g., a paste, etc.), which gives the particles of the physical unclonable function material a random distribution.

Example Implementations

FIGS. 1A through 1D illustrate a physical unclonable function device 100 in accordance with an example implementation of the present disclosure. The physical unclonable function device 100 can include an integrated circuit device 102 and a physical unclonable function coating 110 disposed on the integrated circuit device 102.

As illustrated in FIGS. 1A through 1E, the physical unclonable function device 100 can include an integrated circuit device 102. An integrated circuit device 102 can include one or more integrated circuits formed therein. Additionally, the integrated circuit device 102 may include other modules or components, such as a controller (e.g., processor, memory, and/or a communication interface, etc.). The integrated circuit device 102 may be formed from a portion of a semiconductor wafer substrate, such as a silicon wafer (e.g., p-type wafer, n-type wafer, and so forth), a germanium wafer, and so forth, that includes one or more integrated circuits formed therein. The integrated circuits may be formed through suitable front-end-of-line (FEOL) fabrication techniques near the surface of the semiconductor wafer substrate and resulting integrated circuit device 102 to form an active layer 104. In various implementations, the integrated circuits may include digital integrated circuits, analog integrated circuits, mixed signal integrated circuits, combinations thereof, and so forth. Further, the integrated circuit device 102 may include an active layer 104 that includes a passivation layer, at least one contact pad, a redistribution layer, and/or other components.

In embodiments, the active layer 104 can include an electrode array 106 having multiple electrodes 108. An electrode 108 can include an electrical conductor used to make contact with a nonmetallic part of a circuit (e.g., a dielectric layer). As shown in FIGS. 1A through 1D, the electrode array 106 can be disposed on the integrated circuit device 102 and/or active layer 104 proximate to and/or on a top surface of the integrated circuit device 102 (e.g., surface configured adjacent to a physical unclonable function coating 110 such that the multiple electrodes 108 of the electrode array 106 contact and/or abut the physical unclonable function coating 110. Additionally, the electrodes 108 can be disposed in different configurations, such as random spacing and/or consistent spacing. In a specific embodiment, multiple electrodes 108 in an electrode array 106 are spaced about 1 micrometer. It is contemplated that other electrode 108 spacing can be used (e.g., 1 µm, 5 µm, 10 µm, 50 µm, etc.). Some examples of electrode 108 materials can include copper and/or aluminum. It is contemplated that the electrodes 108 can include other conductive materials.

The electrode array 106 can be electrically coupled to a controller, which may be a portion of the integrated circuit device 102, where the controller can be configured to measure and/or quantify capacitance and/or a change in capacitance between electrodes 108 (e.g., combinations of electrodes 108) within the electrode array 106 and determine unauthorized physical unclonable function device 100 and/or integrated circuit device 102 tampering using a predetermined unique identifier based on measured capacitance in the electrode array 106. In an additional embodiment, the controller may be configured to measure resistance between electrodes 108 within the electrode array 106 for determining tampering. In yet an additional embodiment, the controller may also be configured to measure inductive coupling between on-chip loops.

As illustrated in FIGS. 1A through 1E, the physical unclonable function device 100 can include a physical unclonable function coating 110 disposed on the integrated circuit device 102. In implementations, the physical unclonable function coating 110 includes a dielectric material that is environmentally stable over time. For example, the physical unclonable function coating 110 may include a material that can withstand moisture, temperature, contamination, and/or other environmental factors such that the dielectric constant of the physical unclonable function coating 110 remains substantially constant over time and in different environmental conditions. In one specific embodiment, a physical unclonable function coating 110 includes an epoxy material. It is contemplated that other materials can be used for the physical unclonable function coating 110, such as glass, ceramic, and/or polymers, and so forth. Additionally, the physical unclonable function coating 110 can be formed on the integrated circuit device 102 in different configurations, such as thickness. In one example, the physical unclonable function coating 110 may be formed with a thickness of 3 micrometers (µm). It is contemplated that the physical unclonable function coating 110 may include other thicknesses and configurations (e.g., 1 µm, 5 µm, 10 µm, 50 µm, etc.). In some examples, the physical unclonable function coating 110 can include multiple layers of the same material or differing materials. In a specific embodiment, the physical unclonable function coating 110 includes a first layer of epoxy and a second layer including a dielectric film (e.g., Polyimide (PI), Polybenzoxazole (PBO), Benzocyclobuten (BCB), Silicones, Acrylates, etc.). In another specific embodiment, the physical unclonable function coating 110 can include a first layer of ceramic and a second layer including an epoxy.

In implementations, the physical unclonable function coating 110 can include a physical unclonable function material 112. The physical unclonable function material 112 may be configured to introduce non-uniformity (e.g., randomness) to the physical unclonable function coating 110 and affect the capacitance field lines for providing a unique capacitance within the physical unclonable function coating 110 and electrode array 106 that can be used as a unique identifier for the physical unclonable function device 100 and/or integrated circuit device 102. In implementations, measured capacitance between the electrodes 108 is not necessarily limited between two single elements of physical unclonable function material 112. In these implementations, a difference in measurement between any two sets of physical elements may be used to compare to a unique identifier, which may be adopted when specificity of a single physical element is not sufficient. Utilizing combinations of random elements of physical unclonable function material allows for efficient unique identifier generation. The number of unique bits used in the unique identifier that can be derived can be enhanced by varying the combination of elements of physical unclonable function material 112.

In one implementation, the physical unclonable function material 112 can include a nonconductive material. In a specific example, a nonconductive physical unclonable function material 112 includes glass beads (e.g., 1 μm diameter). Other examples of a nonconductive physical unclonable function material 112 may include polymers, ceramics, etc. In another specific example, the physical unclonable function material 112 can include printed layer(s) of dielectrics. In a specific embodiment, the physical unclonable function coating 110 includes multiple layers of dielectrics where each layer of dielectric includes a randomly printed dielectric layer.

In another implementation, the physical unclonable function material 112 can include a conductive material. In a specific example, a conductive physical unclonable function material 112 includes metal beads (e.g., 1 μm diameter), which may include copper. In another specific example, a conductive physical unclonable function material 112 may include a printed conductive material, such as copper or aluminum. However, it is contemplated that other metals or combinations of metals may be utilized as the conductive metal material for the physical unclonable function material 112. Additionally, the physical unclonable function material 112 can include a combination of nonconductive materials and/or conductive materials that include a combination of shapes (e.g., regular, such as squares, spheres, etc., and/or irregular), sizes, and/or dielectric constants or dielectric coefficients. In one specific example, the physical unclonable function material 112 includes a combination of glass beads and metal beads fabricated in a random pattern throughout the physical unclonable function coating 110. A random pattern of the physical unclonable function material 112 within the physical unclonable function coating 110 can create a random distribution of epsilon (permittivity), which can further be utilized to create a physical unclonable function. In a specific embodiment, a physical unclonable function coating 110 includes a first layer of ceramic with glass beads and a second layer of epoxy with copper beads.

Figure 1A:
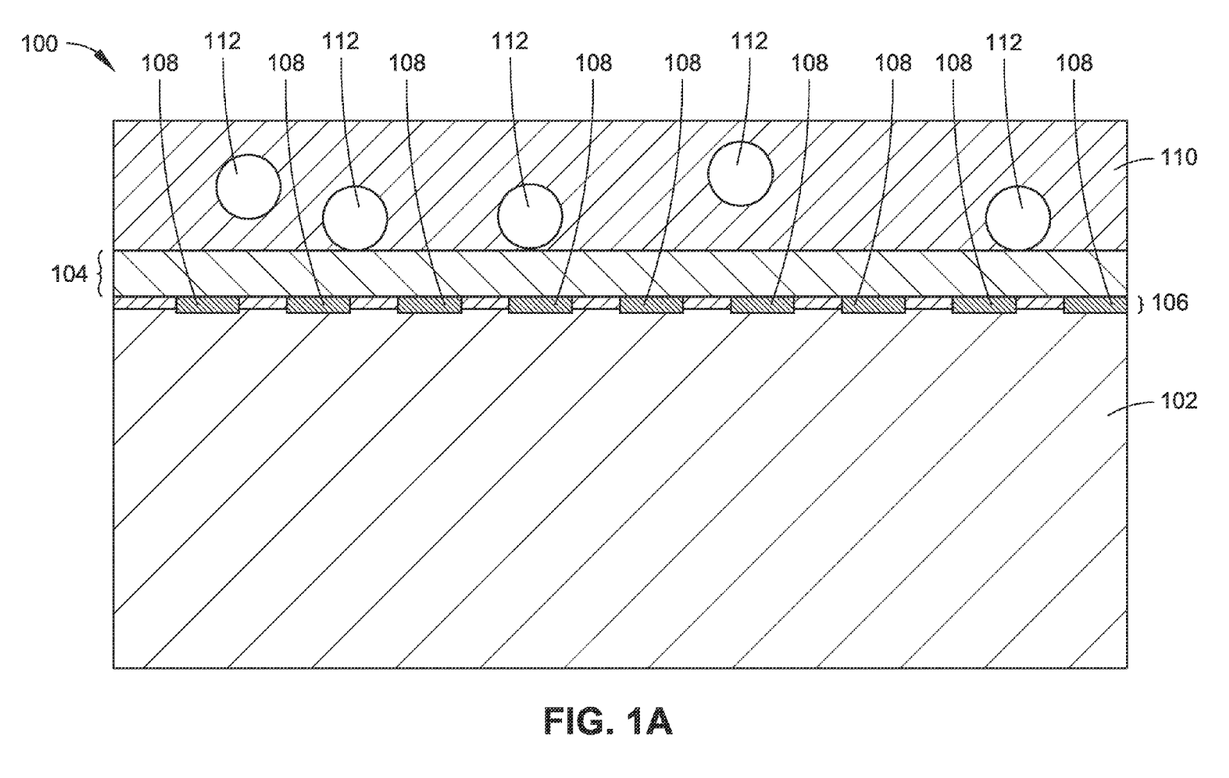
FIG. 1A is a cross sectional view illustrating a physical unclonable function device having a random distribution of PUF material within a PUF coating, in accordance with an example implementation of the present disclosure.
Figure 1B:
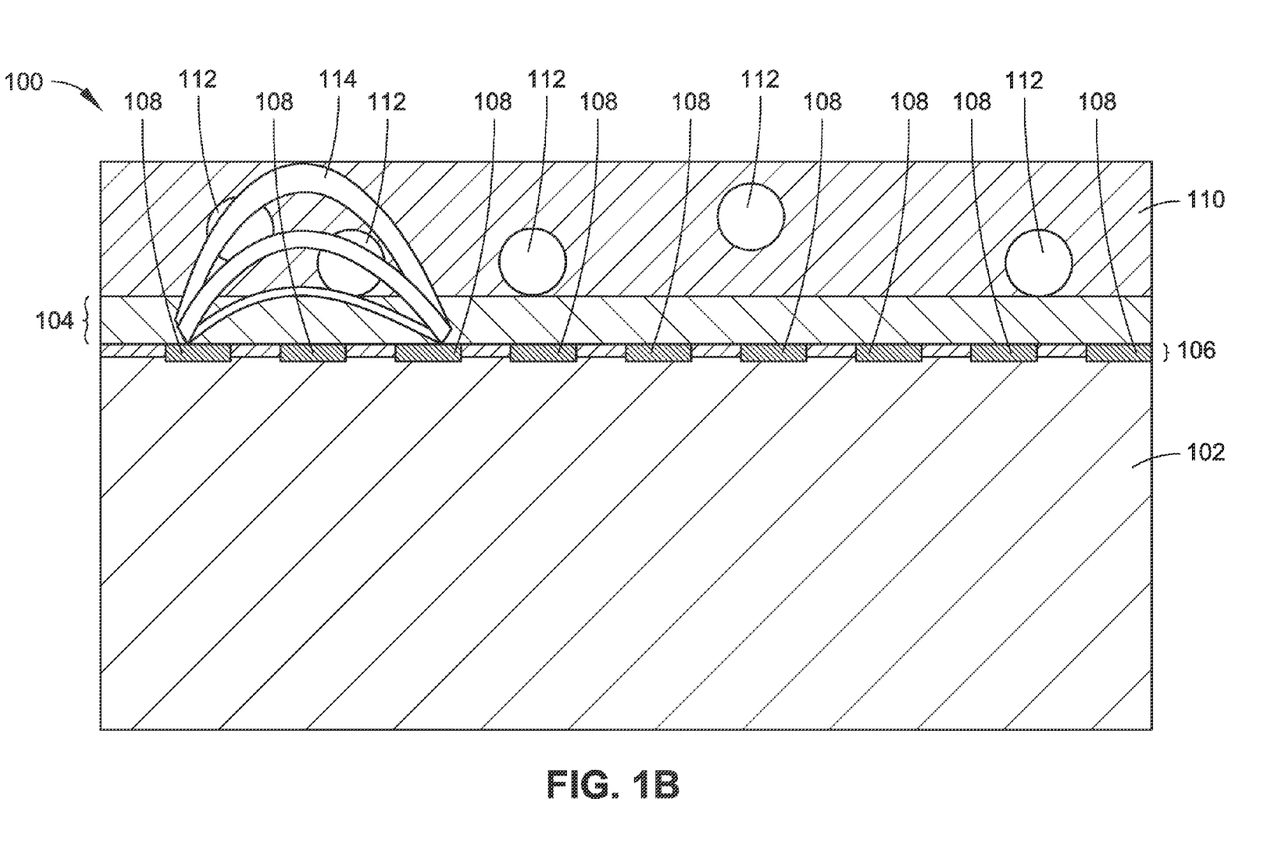
FIG. 1B is a cross sectional view illustrating an exemplary capacitance between electrodes in the physical unclonable function device having a random distribution of PUF material within a PUF coating illustrated in FIG. 1A, in accordance with an example implementation of the present disclosure.
Figure 1C:
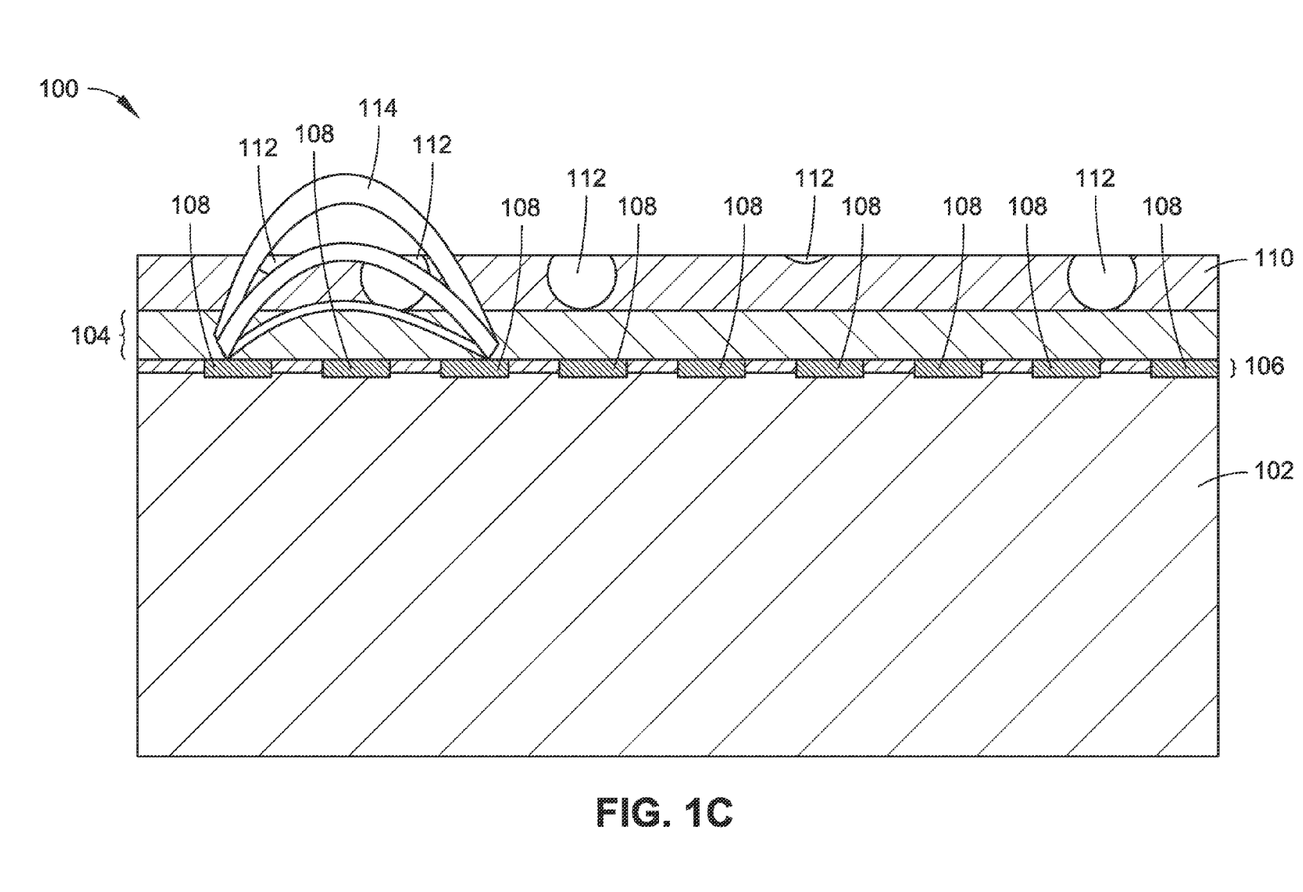
FIG. 1C is a cross sectional view illustrating an exemplary capacitance between electrodes in the physical unclonable function device illustrated in FIG. 1A, where a portion of the PUF coating has been removed, in accordance with an example implementation of the present disclosure.

As illustrated in FIGS. 1B and 1C, the electrode array 106 can produce a capacitance 114 between multiple electrodes 108 in the electrode array 106. FIG. 1B shows an exemplary electrode to electrode capacitance pattern between electrodes 108 in an electrode array 106 on the active layer 104 of the physical unclonable function device 100. In this embodiment, the integrated circuit device 102 (e.g., a controller portion of the integrated circuit device 102) can measure and quantify a distinct capacitance between at least two electrodes 108 in the electrode array 106 and use the distinct capacitance as a unique identifier in the physical unclonable function device 100 and/or the integrated circuit device 102. In implementations, the electrodes 108 used to measure the capacitance pattern may be disposed adjacent to each other or may not be disposed adjacent to each other. The distinct capacitance can be a function of multiple variables, such as the material used for the physical unclonable function coating 110, the thickness of the physical unclonable function coating 110, the material(s) used for the physical unclonable function material 112, the size(s) and/or shape(s) used for the physical unclonable function material 112, the pattern (e.g., random) of the physical unclonable function material 112, the density of the physical unclonable function material 112, the distance between the electrodes 108 used to measure the capacitance, and/or the randomness of the physical unclonable function coating 110 and/or physical unclonable function material 112.

FIG. 1C shows a physical unclonable function device 100 where a portion of the physical unclonable function coating 110 and/or physical unclonable function material 112 has been removed and/or tampered. Similar to the implementation illustrated in FIG. 1B, the electrode array 106 can produce a capacitance 114 between multiple electrodes 108 in the electrode array 106 measured by the integrated circuit device 102 (e.g., controller). However, the measured capacitance 114 when a portion of the physical unclonable function coating 110 and/or physical unclonable function material 112 has been removed and/or tampered results in a capacitance different from the distinct capacitance (and resulting unique identifier) measured before the physical unclonable function coating 110 and/or physical unclonable function material 112 removal and/or tampering (e.g., the distinct capacitance in FIG. 1B) because of the change in the effective dielectric constant due to tampering. This change in capacitance and effective dielectric constant can be detected and/or determined by the physical unclonable function device 100 and/or integrated circuit device 102 (e.g., controller portion) to indicate unauthorized access and/or tampering. When unauthorized access and/or tampering is detected, the physical unclonable function device 100 and/or integrated circuit device 102 may disable, destroy, and/or erase information or data within the physical unclonable function device 100. In some implementations, the unique identifier (e.g., capacitance values) is stored external to the physical unclonable function device 100.

Figure 1D:
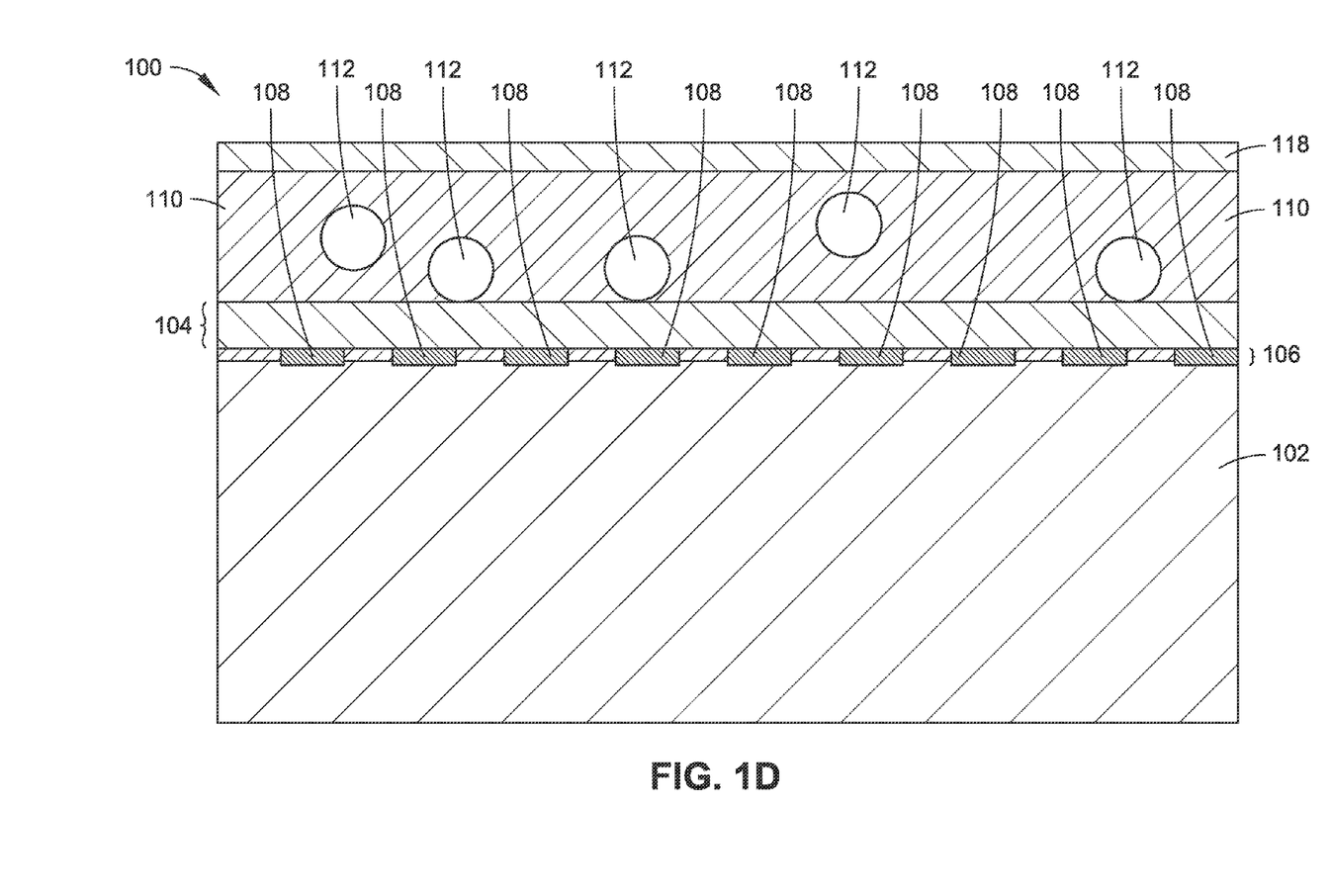
FIG. 1D is a cross sectional view illustrating a physical unclonable function device having a random distribution of PUF material within a PUF coating, where the physical unclonable function device includes a conductive layer, in accordance with an example implementation of the present disclosure.

In some embodiments, as illustrated in FIG. 1D, the physical unclonable function device 100 may include a conductive layer 118 disposed on the physical unclonable function coating 110. In an implementation, the conductive layer 118 can be formed on the surface of the physical unclonable function coating 110, for example using a sputtering process. It is contemplated that other conductive layer 118 deposition processes may be utilized. Some examples of conductive layer 118 materials can include copper, aluminum, etc. The conductive layer 118 may be utilized in an electrode-to-conductive layer capacitance measurement instead of or in addition to an electrode-to-electrode capacitance measurement. In the embodiment shown in FIG. 1D, the integrated circuit device 102 can detect a distinct capacitance measurement created between at least one electrode 108 in the electrode array 106, the conductive layer 118, and/or the physical unclonable function material 112 and further measure a change in the distinct capacitance when a portion of the physical unclonable function coating 110 and/or unclonable function material 112 is removed and/or tampered.

Figure 1E:
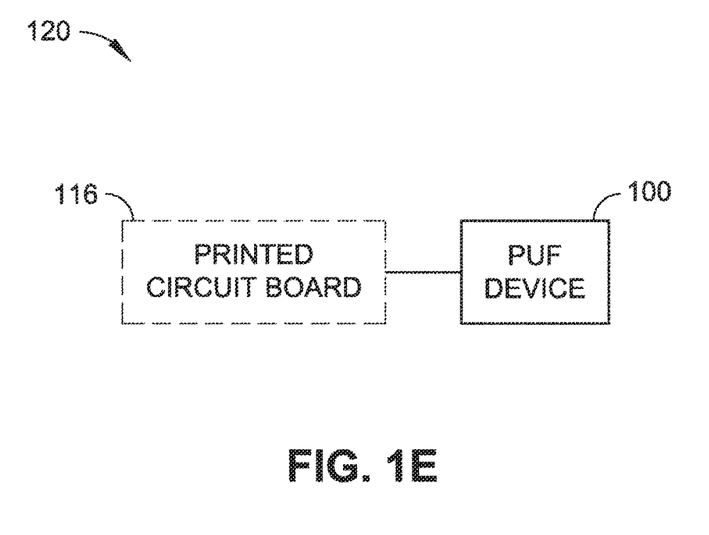
FIG. 1E illustrates an environmental view of an encryptable electronic device, in accordance with an example implementation of the present disclosure.

As illustrated in FIG. 1E, an encryptable electronic device 120 can include a physical unclonable function coating 110 coupled to a printed circuit board 116 or other electronic device. The encryptable electronic device 120 can utilize the physical unclonable function coating 110 for increased security and tamper resistance.

Example Processes

Figure 2:
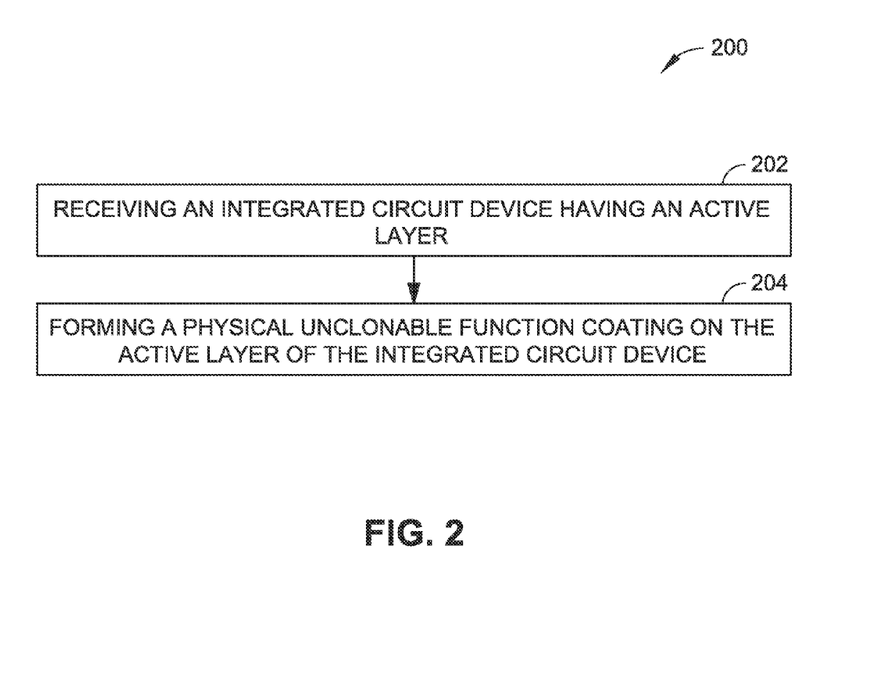
FIG. 2 is a flow diagram illustrating a process in an example implementation for fabricating a physical unclonable function device, such as the physical unclonable function device shown in FIG. 1A.
Figure 3A:
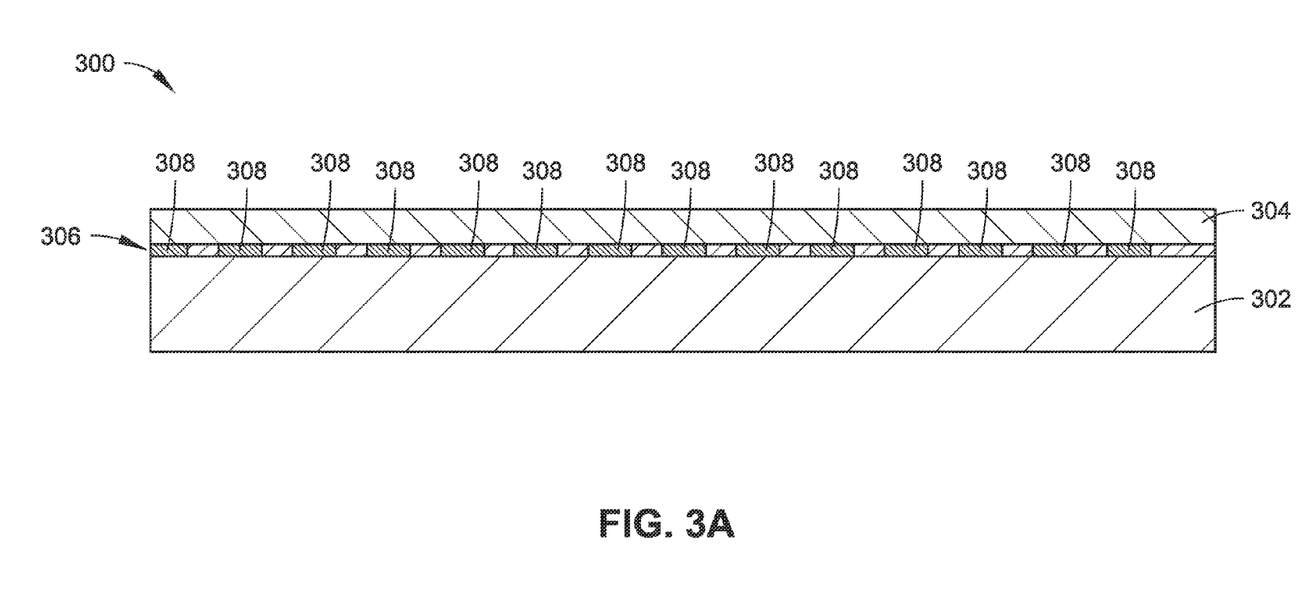
FIG. 3A is a partial cross-sectional view illustrating the fabrication of a physical unclonable function device, such as the physical unclonable function device shown in FIG. 1A, in accordance with the process shown in FIG. 2.
Figure 3B:
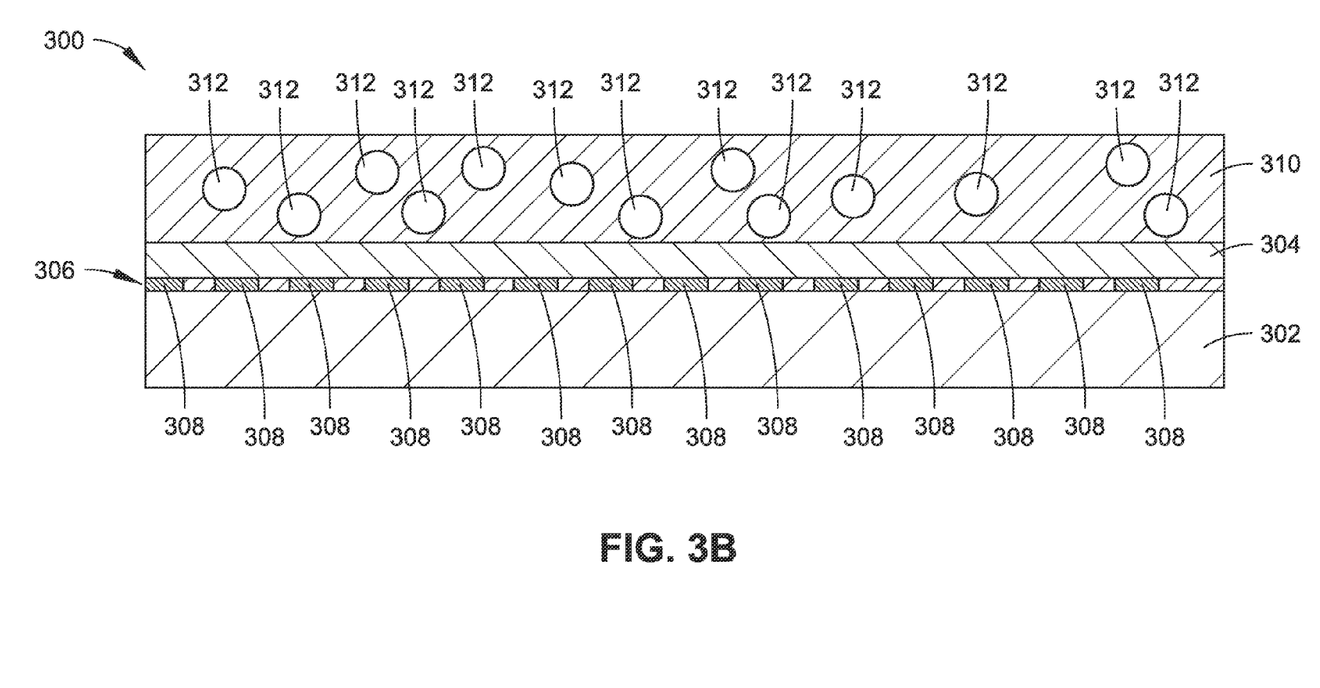
FIG. 3B is a partial cross-sectional view illustrating the fabrication of a physical unclonable function device, such as the physical unclonable function device shown in FIG. 1A, in accordance with the process shown in FIG. 2.

The following discussion describes example techniques for fabricating a physical unclonable function device, such as the physical unclonable function device 100 shown in FIGS. 1A through 1E. FIG. 2 depicts an example process 200 for fabricating the physical unclonable function device 100 shown in FIGS. 1A through 1E.

As shown in FIG. 2, an integrated circuit device having an active layer is received (Block 202). In implementations, receiving an integrated circuit device 102 may include receiving an integrated circuit device 102 that has been formed from at least a portion of a semiconductor wafer substrate, such as a silicon wafer (e.g., p-type wafer, n-type wafer, and so forth). Receiving the integrated circuit device 102 may include receiving an integrated circuit device 102 that is partially fabricated and may include additionally processing the integrated circuit device 102. For example, some additional processing steps may include forming and/or exposing at least one electrode 108 and/or depositing a passivation layer on the active layer 104 of the integrated circuit device 102. In a specific example, receiving the integrated circuit device 102 includes receiving an integrated circuit device 102 with an exposed electrode array, where the integrated circuit device 102 is configured to use a capacitance to determine a unique identifier for physical unclonable function device 100 that includes integrated circuit device 102.

Next, a physical unclonable function coating is formed on the active layer of the integrated circuit device (Block 204). In implementations, forming a physical unclonable function coating 110 on the active layer 104 of the integrated circuit device 102 can include utilizing various deposition techniques, such as molding, screen printing, and/or sputtering. In one specific example, forming a physical unclonable function coating 110 on the active layer 104 of the integrated circuit device 102 includes sputtering a lumpy physical unclonable function coating 110 including epoxy with a physical unclonable function material 112 including glass beads onto the active layer 104. In this specific example, using a sputtering process may ensure that the physical unclonable function coating 110 and/or the physical unclonable function material 112 is distributed in a random fashion, which resulting randomness provides for an increase security function for a physical unclonable function device 100. Additionally, forming a physical unclonable function coating 110 may include forming a conductive layer 118 on the physical unclonable function coating 110. In a specific embodiment, forming a conductive layer 118 can include using a physical vapor deposition process, a chemical vapor deposition process, and/or an electroplating process, for example to form a layer of copper.

In additional embodiments, forming a physical unclonable function coating 110 on the active layer 104 of the integrated circuit device 102 may include measuring a distinct capacitance within the electrode array 106 (and/or between the electrode array 106 and conductive layer 118) and determining a unique device identifier using the distinct capacitance. In these additional embodiments, the integrated circuit device 102 (e.g., controller portion) can determine the unique device identifier. Further, the integrated circuit device 102 and/or controller portion can detect tampering or unauthorized access when the physical unclonable function coating 110 is removed and/or tampered by detecting a change in capacitance and/or a different capacitance than the original distinct capacitance.

Further, forming the physical unclonable function coating 110 may include coupling the physical unclonable function device 100 to another device, such as a printed circuit board 116.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A physical unclonable function device, comprising:
an integrated circuit device including an active layer, the active layer including an electrode array with multiple electrodes;
a physical unclonable function coating disposed on the active layer, wherein the physical unclonable function coating comprises a dielectric material, and wherein the physical unclonable function coating includes a physical unclonable material arranged in a random configuration;
wherein the physical unclonable function coating includes a glass material and the physical unclonable material includes glass beads; and
a distinct capacitance between at least two electrodes of the electrode array is used as a unique identifier in the physical unclonable function device depending on a density of the physical unclonable function material and a distance between the at least two electrodes of the electrode array.

2. The physical unclonable function device of claim 1, wherein the glass beads are spheres.

3. The physical unclonable function device of claim 2, wherein the spheres have a diameter of 1 μm.

* * * * *